United States Patent
Maharyta

(10) Patent No.: US 8,729,913 B2
(45) Date of Patent: May 20, 2014

(54) CAPACITANCE SENSING SYSTEMS, CIRCUITS AND METHODS THAT INCLUDE CURRENT CONVEYOR BASED OSCILLATORS

(75) Inventor: Andriy Maharyta, Lviv (UA)

(73) Assignee: Cypress Semiconductor Corporation, San Jose, CA (US)

(*) Notice: Subject to any disclaimer, the term of this patent is extended or adjusted under 35 U.S.C. 154(b) by 387 days.

(21) Appl. No.: 13/185,447

(22) Filed: Jul. 18, 2011

(65) Prior Publication Data

US 2012/0049868 A1    Mar. 1, 2012

Related U.S. Application Data

(60) Provisional application No. 61/376,460, filed on Aug. 24, 2010.

(51) Int. Cl.
    G01R 27/26    (2006.01)
(52) U.S. Cl.
    USPC ........................... 324/679; 324/658

(58) Field of Classification Search
    None
    See application file for complete search history.

(56) References Cited

U.S. PATENT DOCUMENTS

| 5,055,719 | A | 10/1991 | Hughes | |
|---|---|---|---|---|
| 7,535,264 | B2* | 5/2009 | Hiller et al. | 327/66 |
| 7,683,641 | B2* | 3/2010 | Hargreaves et al. | 324/686 |
| 8,487,639 | B1* | 7/2013 | Walsh et al. | 324/679 |
| 2011/0025629 | A1* | 2/2011 | Grivna et al. | 345/173 |

* cited by examiner

Primary Examiner — Vinh Nguyen

(57) ABSTRACT

A capacitance sensing system may include a current conveyor circuit coupled to receive induced current from a capacitance sensing structure at a low impedance current input port; and a comparator having an input coupled to a high impedance output port of the current conveyor circuit, and an output coupled to the current conveyor circuit by a feedback path and coupled to drive the capacitance sensing structure to generate the induced current.

10 Claims, 13 Drawing Sheets

CAPACITANCE SENSING SYSTEMS, CIRCUITS AND METHODS THAT INCLUDE CURRENT CONVEYOR BASED OSCILLATORS

This application claims the benefit of U.S. Provisional Patent Application Ser. No. 61/376,460, filed on Aug. 24, 2010, the contents of all of which are incorporated by reference herein.

TECHNICAL FIELD

The present disclosure relates generally to sensing devices, and more particularly to devices that determine the proximity of one or more objects based on capacitance sensing.

BACKGROUND

Computing devices may include human interface devices (HIDs) that enable a person to create input data for, and in some cases sense output data from, a computing device. Computing devices may include, but are not limited to, personal computers (including both desktop and notebook computers), tablet computing devices, mobile handsets, personal data assistants (PDAs), kiosks, point of sale devices, or other personal entertainment devices (i.e., portable gaming devices, portable music and/or video players, etc.).

Some HIDs include a sensor surface. A sensor surface may detect the contact of an object on a surface, or the proximity of an object to the surface. Some of the many variations of a sensor surface include, but are not limited to: a touch sensor pad (i.e., touchpad) often used to emulate the function of a personal computer (PC) mouse, or a touchscreen often used as an interface for mobile sets, tablet computers and some personal computers. Sensor surfaces may provide one-dimensional sensing, detecting an object movement in one dimension (e.g., slider, single touch button, etc.), two-dimensional sensing, detecting movement along two axes, and may even include three dimensional sensing (sensing an object position in space proximate to the sensor surface).

Some sensor surfaces may operate by way of capacitance sensing utilizing sensor electrodes. A capacitance, as detected by sensor electrodes, may change as a function of the proximity of an object to the sensor electrodes. The object can be, for example, a stylus or a user's finger. In some devices, a change in capacitance may be detected by each sensor in the X and Y dimensions of a sensor array. According to detected capacitance changes, a position of an object (or objects) may be determined.

FIG. 25 shows one example of conventional "self" capacitance sensing. FIG. 25 shows a set of sensor electrodes 2500. A self-capacitance (Cp) of one selected electrode 2502 may be sensed by connecting such a sensor to a receive connection (shown as Rx). A self-capacitance (Cp) may be a capacitance of the selected electrode 2502 with respect to ground. If a sensed self-capacitance is outside of a threshold limit, an object may be considered present at the position of the selected electrode 2502. Conversely, if a sensed self-capacitance is within a threshold limit, an object may not be considered present at the position of the selected electrode 2502.

FIG. 26 shows one example of mutual capacitance sensing. FIG. 26 shows two sets of sensor electrodes 2600-0 and -1. A mutual capacitance (Cm) may exist between two electrodes: a receive (Rx) electrode 2602-0 and a transmit (Tx) electrode 2602-1. It is understood that one set of electrodes (e.g., 2600-0 or 2600-1) may be disposed perpendicular to the other set of electrodes (e.g., 2600-1 or 2600-0). A periodic signal may be transmitted on the Tx electrode 2602-1. Due to mutual capacitance (Cm), the electrical signal at the Tx electrode 2602-1 may induce a current on the Rx electrode 2602-0. Similar to the conventional self-capacitance sensing of FIG. 25, if a sensed mutual capacitance is outside of a threshold limit, an object may be considered present at the position of the selected electrodes 2602-0/1. Conversely, if a sensed mutual capacitance is within a threshold limit, an object may not be considered present at the position of the selected electrodes 2602-0/1.

DETAILED DESCRIPTION

Figure 1:
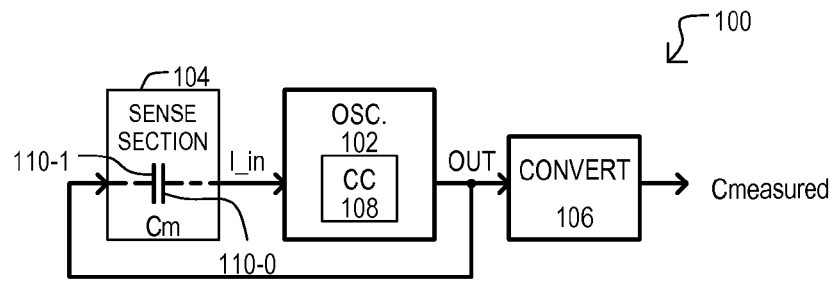
FIG. 1 is a block schematic diagram of a capacitance sensing system having a current conveyor (CC) based oscillator according to an embodiment.

Various embodiments will now be described that show capacitance sensing systems, devices and methods that may utilize relaxation type oscillating approaches in combination with a current conveyor circuit to generate an oscillating output that varies according to a mutual capacitance between capacitance sensing electrodes.

Particular embodiments may induce current variations at a low impedance current input port of a current conveyor circuit by driving a mutual capacitance between sense electrodes with an oscillating signal. Thus, a manner by which oscillating signals are generated may vary in response to such a mutual capacitance.

In the various embodiments described below, like sections may be referred to by the same reference character but with the leading digit(s) corresponding to the figure number.

Referring now to FIG. 1, a capacitance sensing system according to an embodiment is shown in a block diagram and designated by the general reference character 100. A system 100 may include an oscillator circuit 102, a capacitance sense structure 104, and a capacitance value generator 106. An oscillator circuit 102 is a current conveyor based oscillator circuit, and thus includes current conveyor circuit 108. A current conveyor circuit 108 may convey a current received at a low impedance current input port to a high impedance current output port. In the embodiment shown, oscillator circuit 102 may receive a time varying input current I_in, and in response, generate a time varying output signal OUT.

A capacitance sense structure 104 may present a capacitance Cm that may vary in response to the proximity of an object. A capacitance sensing structure 104 may receive output signal OUT from oscillator circuit 102 and provide an input current I_in to the oscillator circuit 102. In the particular embodiment shown, capacitance sense structure 104 may have one or more first electrodes 110-0 and one or more second electrodes 110-1, and a capacitance Cm may be a mutual capacitance between the first and second electrodes. Further, second electrode(s) may be driven in response to time varying output signal OUT, to induce input current I_in. In such a configuration, in response to changes in capacitance Cm (such as those arising from the proximity of an object to electrodes 110-0/1) an induced input current I_in may vary causing oscillator circuit 102 to change its oscillating behavior.

Capacitance value generator 106 may generate a sensed capacitance value Cmeasured in response to signal OUT generated by oscillator circuit 102. A capacitance value generator 106 may take a form suitable to the type of signal output from oscillator circuit 102. As will be described in more detail below, a capacitance value generator 106 may take the form of a counter circuit, if signal OUT varies in frequency in response to changes in Cm, or may take the form of an integrator circuit if signal OUT varies in duty cycle in response to Cm, as but two examples.

In this way, a system may include a current conveyor based oscillator circuit that varies an output signal in response to an input current generated by a mutual capacitance between two or more selected electrodes.

Figure 2:
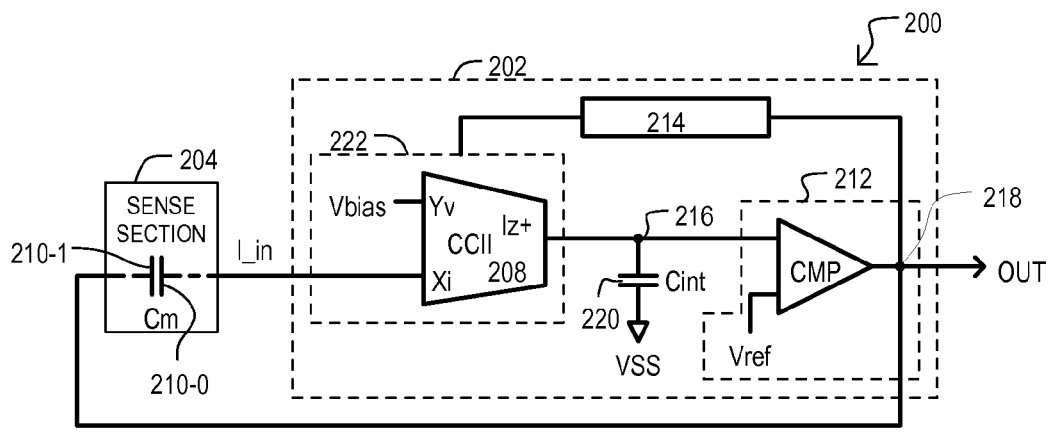
FIG. 2 is a block schematic diagram of a capacitance sensing system that includes a CC based relaxation oscillator section according to an embodiment.

Referring now to FIG. 2, a capacitance sensing system according to another embodiment is shown in a block diagram and designated by the general reference character 200. A system 200 may be one very particular implementation of that shown in FIG. 1. A system 200 may include an oscillator circuit 202 and a capacitance sense structure 204.

An oscillator circuit 202 may include a current conveyor section 222, an integrating capacitor 220, a comparator section 212, and a feedback path 214. A current conveyor section 222 may include a current conveyor circuit 208. A current conveyor circuit 208 may have a low impedance current input port (Xi) that receives an input current I_in originating from capacitance sense structure 204, an input voltage terminal Yv that receives a bias voltage Vbias, and a high impedance output current port Iz+ connected to integrating node 216. A current conveyor circuit 208 may take the form of any suitable current conveyor circuit, including first generation current conveyor circuits (CCI) and/or second generation current conveyor circuits (CCII). In the particular embodiment of FIG. 2, current conveyor circuit 208 may be a CCII circuit.

An integrating capacitor 220 may be connected between integrating node 216 and a reference voltage, which in this example may be a low power supply voltage VSS. An output from current conveyor section 222 may charge and discharge integrating capacitor 210.

A comparator section 212 may have a first input connected to integrating node 216, a second input connected to a reference voltage (Vref), and an output connected to feedback path 214. According to a potential at integrating node 216, a comparator section 212 may drive an output signal OUT on output node 218. This, in combination with feedback path 214 (which may be a negative feedback path), may generate an oscillating output signal. More particularly, in one very particular embodiment, while a potential at integrating node 216 is greater the Vref, a signal OUT from comparator section 212 may have one value (e.g., low). Such a signal OUT may be applied, via feedback path 214, to current conveyor section 222, which may generate a current output that causes integrating capacitor section 212 to discharge. However, once a potential at integrating node 216 is less than Vref, a signal OUT from comparator section 212 may switch to another value (e.g., high). Such a signal OUT may cause current conveyor circuit 208 to generate a current output that causes integrating capacitor section 212 to charge. Such charging and discharging generates an oscillating signal.

Referring still to FIG. 2, an output of comparator section 212 (OUT) may also be connected to capacitance sense structure 204. Signal OUT may induce a current I_in from capacitance sense structure 204, via a mutual capacitance (Cm) between two or more electrodes 210-0/1. Induced current I_In may be provided as an input current to current conveyor section 222.

In such an arrangement, as capacitance Cm changes an induced input current I_in changes, causing a change in an output current (Iz+) from current conveyor circuit 208. A change output current (Iz+) from current conveyor circuit 208 may alter the current output from current conveyor section 222 that charges and discharges integrating capacitance 220. Consequently, a response of signal OUT will vary as Cm varies.

In this way, a system may include an oscillator circuit with a current conveyor having a low impedance current input port that receives an input current from a capacitance sensing structure, and a high impedance current output connected to an integrating node.

Figure 3:
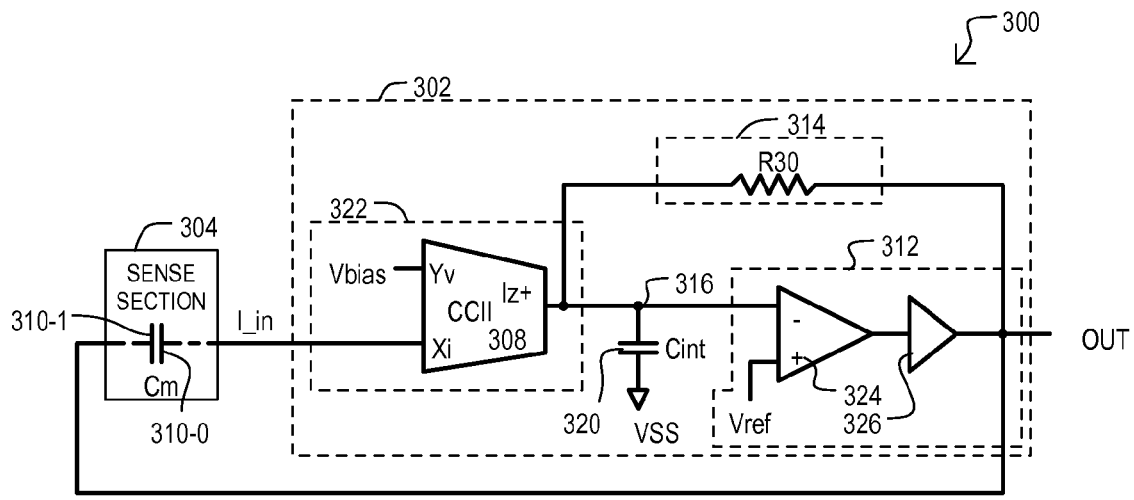
FIG. 3 is a block schematic diagram of a capacitance sensing system that includes a CC based relaxation oscillator section with a feedback loop connected to a CC output port according to an embodiment.

Referring now to FIG. 3, a capacitance sensing system according to another embodiment is shown in a block diagram and designated by the general reference character 300. A system 300 may be one very particular implementation of that shown in FIG. 2.

FIG. 3 differs from FIG. 2 in that a feedback path 314 is shown particularly connected between an output of comparator section 312 and a high impedance current output port (Iz+) of current conveyor circuit 308. Further, a feedback path 314 may include a resistance R30.

FIG. 3 also varies from FIG. 2 in that a comparator section 312 may include a comparator circuit 324 having a (−) input connected to integrating node 316, a (+) input connected to a reference voltage Vref, and an output connected to a buffer circuit 326. Buffer circuit 326 may buffer an output of comparator circuit 324 to generate output signal OUT.

In a configuration like that of FIG. 3, an integrating node 316 may charge and discharge in an oscillating operation in response to a charging/discharging current that may vary according to any changes capacitance Cm. Such a charging/discharging current may include a feedback current component (i.e., that through resistance R30), as well as a current conveyor component (i.e., that output from port Iz+).

In this way, a system may include an oscillator circuit with an integrating node that is charged and discharged via a feedback path, and a current conveyor circuit output current that varies in response to a sensed capacitance.

Figure 4:
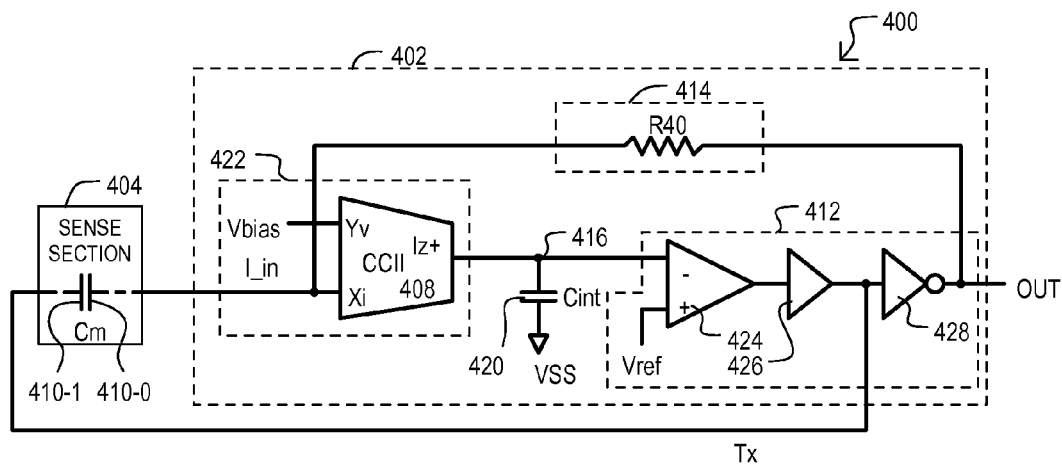
FIG. 4 is a block schematic diagram of a capacitance sensing system that includes a CC based relaxation oscillator section with a feedback loop connected to a CC input port according to an embodiment.

Referring now to FIG. 4, a capacitance sensing system according to still another embodiment is shown in a block diagram and designated by the general reference character 400. A system 400 may be one very particular implementation of that shown in FIG. 2.

FIG. 4 differs from FIG. 2 in that a feedback path 414 is shown particularly connected between an output of comparator section 412 and a low impedance current input port (Xi) of current conveyor circuit 408. Further, a feedback path 414 may include a resistance R40.

FIG. 4 also varies from FIG. 2 in that a comparator section 412 may include a comparator circuit 424 and buffer circuit 426 connected in the same fashion as 324 and 326 in FIG. 3. Comparator section 412 further includes an inverting buffer circuit 428 with an input connected to the output of buffer circuit 426 and an output that provides signal OUT. An output of buffer circuit 426 may be a transmit signal (Tx), that is the inverse of output signal OUT. Signal Tx may be provided to capacitance sensing structure 404.

In a configuration like that of FIG. 4, an integrating node 416 may charge and discharge in an oscillating operation in response to a charging/discharging current. However, unlike FIG. 3, a charging/discharging current may be the output current (Iz+) conveyed by current conveyor circuit 408 in response to an input current at low impedance input current port Xi. Such a current conveyor input current may include a feedback current component (i.e., that through resistance R40), as well as an input current component (I_in) from capacitance sense structure 404.

In this way, a system may include an oscillator circuit with an integrating node that is charged and discharged via a current output port from a current conveyor circuit. An input current to the current conveyor circuit may include a feedback component generated a sense current component that varies in response to a sensed capacitance.

Embodiments like those shown in FIGS. 3 and 4 may provide an output signal OUT having a period (Tx) given by the following relationship:

$$Tx \cong 4 \times (1/K_1) \times R_{FB} \times Cm$$

where $K_1$ is a current gain factor of current conveyor circuit (e.g., 308/408) and $R_{FB}$ is a feedback resistance (e.g., R30 or R40). Such a relationship can provide a linear relationship between oscillator period (Tx) and sensed capacitance (Cm).

Figure 5:
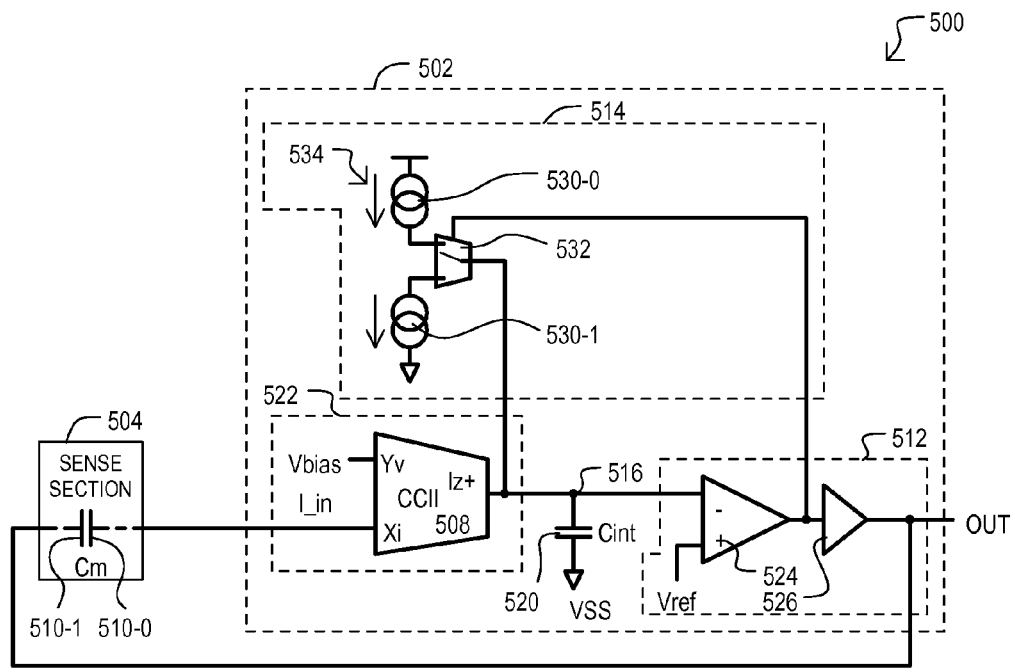
FIG. 5 is a block schematic diagram of a capacitance sensing system that includes a CC based relaxation oscillator section with a switching current source in a feedback loop according to an embodiment.

Referring now to FIG. 5, a capacitance sensing system according to still another embodiment is shown in a block diagram and designated by the general reference character 500. A system 500 may be one very particular implementation of that shown in FIG. 2.

FIG. 5 differs from FIG. 2 in that a feedback path 514 is shown connected between an output of comparator section 512 and a hiqh impedance current output port (Iz+) of current conveyor circuit 508, as in the case of FIG. 3. Further, a feedback path 514 may include a switching current source circuit 534. A switching current source circuit 534 may include a current source circuit 530-0, a current sink circuit 530-1, and a current switch circuit 532. The amount of current sourced and sunk by current source/sink circuits 530-0/1 may be programmable. In one particular embodiment, such circuits (530-0/1) may be current digital-to-analog converters (IDACs).

FIG. 5 also includes a comparator section 512 having a configuration like that of FIG. 3.

In operation, according to an output of comparator circuit 524, current switch circuit 532 may connect either current sink circuit 530-1 or current source circuit 530-0 to integrating node 516. At the same time, a current at current conveyor output port Iz+, may provide a charging/discharging current to integrating node 516 that varies according to a sensed capacitance Cm.

In this way, a system may include an oscillator circuit with an integrating node that is charged and discharged via a feedback path with a current switch, and a current conveyor circuit output current that varies in response to a sensed capacitance.

Figure 6:
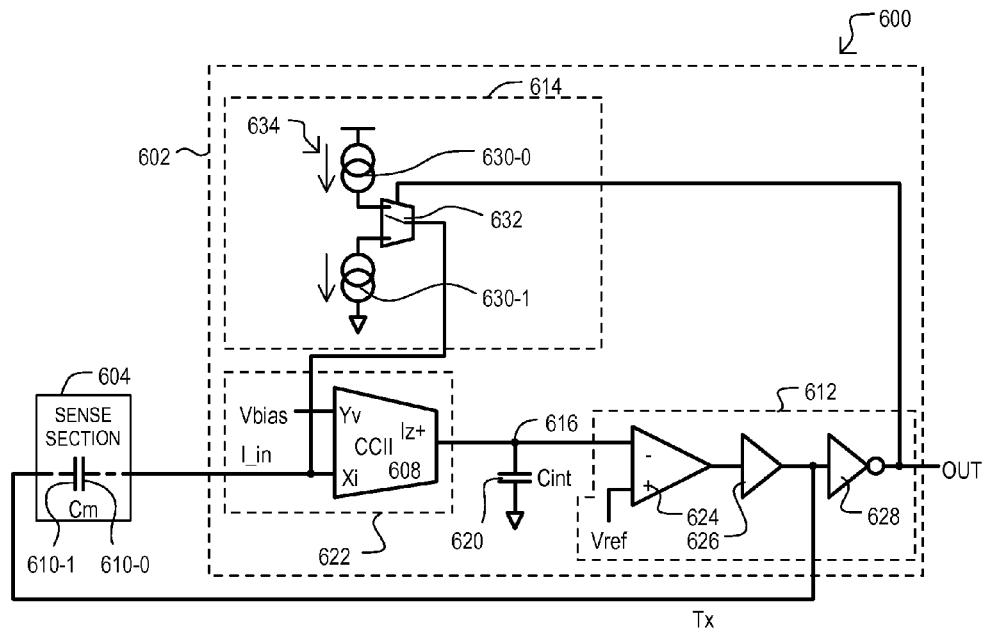
FIG. 6 is a block schematic diagram of a capacitance sensing system that includes a CC based relaxation oscillator section with a switching current source in a feedback loop according to another embodiment.

Referring now to FIG. 6, a capacitance sensing system according to still another embodiment is shown in a block diagram and designated by the general reference character 600. A system 600 may be one very particular implementation of that shown in FIG. 2.

FIG. 6 differs from FIG. 2 in that a feedback path 614 is connected as in the case of FIG. 4. Further, a feedback path 614 may include a switching current source circuit 634 like that of FIG. 5. FIG. 6 also includes a comparator section 612 having a configuration like that of FIG. 4.

In operation, according to an output of comparator circuit 624 (as inverted by inverting buffer 628), current switch circuit 632 may connect either current source circuit 630-0 or current sink circuit 630-1 to the low impedance input current port Xi of current conveyor circuit 608. At the same time, a current is provided to input current port Xi from sense structure 604 that may vary according to changes in Cm. Thus, current conveyor circuit 608 may convey a current having a feedback component as well as a sense component that varies according to a sensed mutual capacitance.

In this way, a system may include an oscillator circuit with an integrating node that is charged and discharged via a current output port from a current conveyor circuit. Such an output current may be generated by conveying an input current having feedback component generated with a current switching circuit in response to the integrating node.

Embodiments like those shown in FIGS. 5 and 6 may provide an output signal OUT having a period (Tx) given by the following relationship:

$$Tx \approx 2 \times (1/K_1) \times (U_{VDD}/\text{Iint}) \times Cm$$

where $K_1$ is a current gain factor of current conveyor circuit (e.g., 508/608), $U_{VDD}$ is a voltage magnitude of a signal Tx, and Iint is a current source/sunk by a current switch circuit (e.g., 534/634). Such a relationship can provide a linear relationship between oscillator period (Tx) and sensed capacitance (Cm). Further, embodiments in which Iint is tunable (e.g., Iint is generated by IDACs) may enable precise selection of an output period.

In embodiments shown in FIGS. 2 to 6, oscillations may freely run as an integrating node is charged and discharged at a frequency that may change in response to variation in sensed capacitance (e.g., Cm). However, alternate embodiments may synchronize such charging and discharging operations for more deterministic operations. In particular, synchronizing operations may enable readings from multiple capacitance sensing circuits to be timed with respect to one another. Embodiments having such a synchronizing function will now be described.

Figure 7:
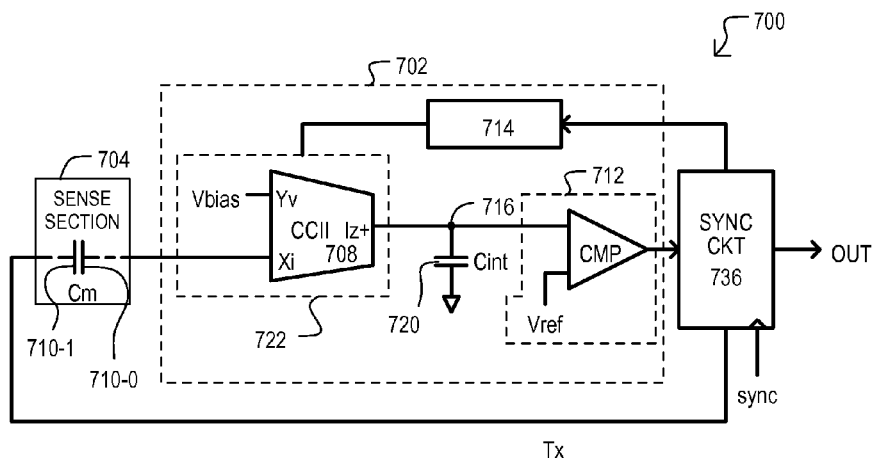
FIG. 7 is a block schematic diagram of a capacitance sensing system that includes a synchronous control CC based oscillator according to an embodiment.

Referring now to FIG. 7, a capacitance sensing system according to another embodiment is shown in a block diagram and designated by the general reference character 700. A system 700 may be one very particular implementation of that shown in FIG. 1. A system 700 may include an oscillator circuit 702, a capacitance sense section 704, and a synchronizing circuit 736.

An oscillator circuit 702 may include sections like that of FIG. 2. However, unlike FIG. 2, an output of comparator section 712 may be received by synchronizing circuit 736. Further, various operations of system 700 may be controlled according to a timing established by synchronizing circuit 736. In the particular embodiment of FIG. 7, signals through feedback path 714 and applied to capacitance sense structure 704, may be timed according to a synchronizing signal "sync" received by synchronizing circuit 736. Accordingly, in an embodiment like that of FIG. 7, an output signal OUT may not be a free running frequency that varies with Cm, but rather a signal synchronized with signal "sync", but having characteristic other than frequency (e.g., duty cycle, slope, etc.) that vary with a capacitance Cm.

In this way, a system may include a current conveyor circuit that charges and discharges an integrating node with a current that may vary in response to a sensed capacitance, at a timing established by a synchronizing signal and not a free running oscillation frequency.

Figure 8:
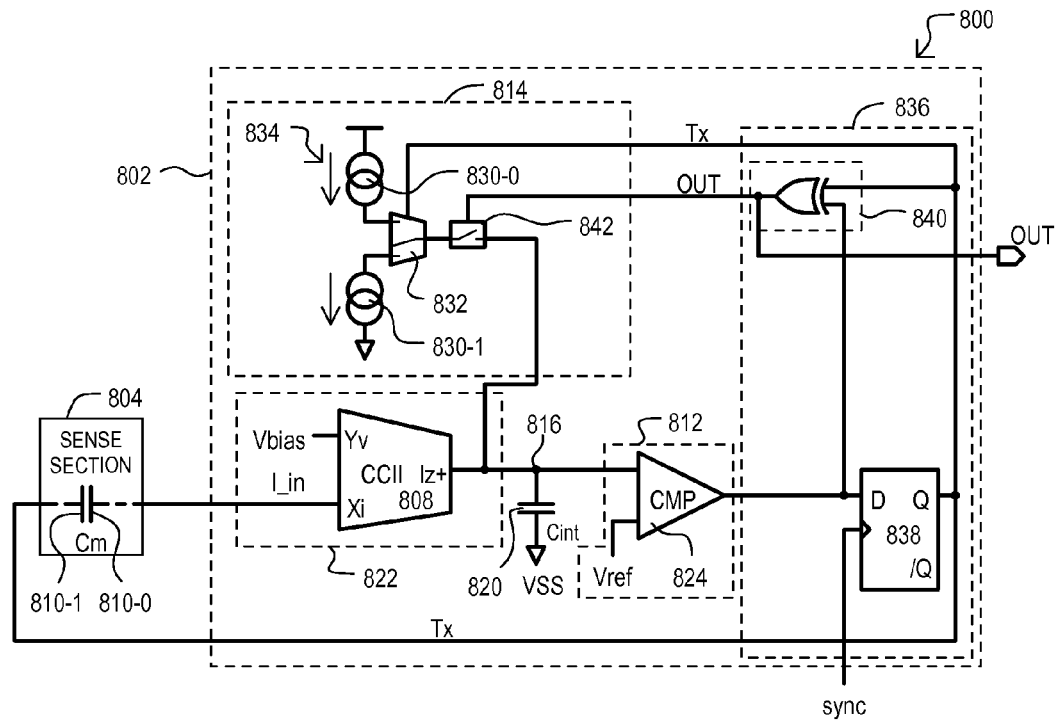
FIG. 8 is a block schematic diagram of a capacitance sensing system that includes a synchronous control CC based oscillator section with a feedback loop connected to a CC output port according to an embodiment.

Referring now to FIG. 8, a capacitance sensing system according to another embodiment is shown in a block diagram and designated by the general reference character 800. A system 800 may be one very particular implementation of that shown in FIG. 7.

FIG. 8 differs from FIG. 7 in that a synchronizing circuit 836 is shown to particularly include a flip-flop circuit 838 and a logic circuit 840. A flip-flop circuit 838 may gate an output of comparator section 812 in response to a synchronizing signal (sync) to thereby generate a transmit signal Tx. Logic circuit 840 may logically combine an output of comparator section 812 with signal Tx to generate an output signal OUT. In the particular embodiment shown, a logic circuit 840 may be an exclusive OR circuit.

FIG. 8 also differs from FIG. 7 in that feedback path 814 is shown particularly connected between synchronizing circuit 836 and a high impedance current output port (Iz+) of current conveyor circuit 808. Further, a feedback path 814 may include a switching current source circuit 834. A switching current source circuit 834 may include a current source circuit 830-0, a current sink circuit 830-1, a current switch circuit 832, and an enabling switch 842.

In operation, according to synchronized signal Tx from synchronizing circuit 836, current switch circuit 832 may connect either current sink circuit 830-1 or current source circuit 830-0 to enabling switch 842. In response to synchronized output signal OUT, an enabling switch 842 can connect current switch circuit 832 to integrating node 816. At the same time, a current at input port (Xi) of current conveyor circuit 808 (which may vary according to Cm) may be induced by synchronized signal Tx. Thus, an integrating node 816 may charge and discharge at a rate that may vary according to Cm, but in synchronism with a timing signal (sync).

In this way, a system may include an oscillator circuit with an integrating node that is charged and discharged via a feedback path, and a current conveyor circuit output current that varies in response to a sensed capacitance. The feedback path current and current conveyor circuit current may be applied to the integrating node according to a synchronizing signal.

Figure 9:
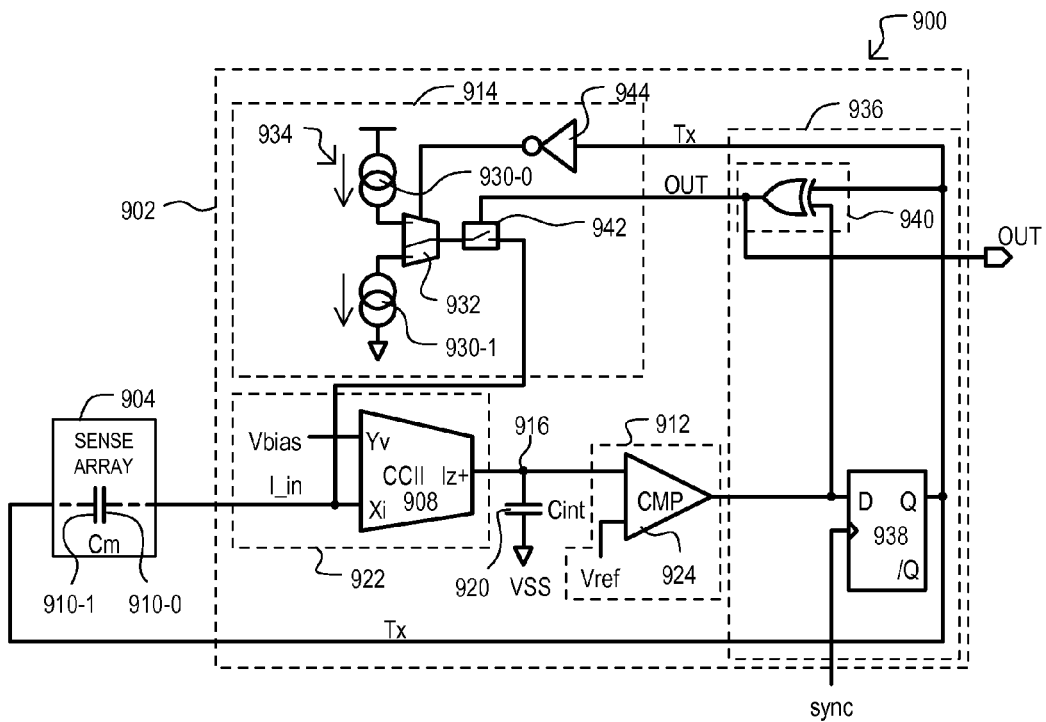
FIG. 9 is a block schematic diagram of a capacitance sensing system that includes a synchronous control CC based oscillator section with a feedback loop connected to a CC input port according to an embodiment.

Referring now to FIG. 9, a capacitance sensing system according to a further embodiment is shown in a block diagram and designated by the general reference character 900. A system 900 may be one very particular implementation of that shown in FIG. 7.

FIG. 9 differs from FIG. 7 in that a synchronizing circuit 936 may have a structure like that of FIG. 8. However, unlike FIG. 8, feedback path 914 is shown connected between synchronizing circuit 936 and a low impedance current input port (Xi) of current conveyor circuit 908. Further, an inverter 944 is included to appropriately invert the feedback current flow at current input port (Xi).

In the embodiment of FIG. 9, an integrating node 916 may charge and discharge in an oscillating operation in a manner like that described for FIG. 6. However, unlike FIG. 6, switching current source 934 may be operated by synchronizing circuit 936, rather than in a free-running fashion. Similarly, mutual capacitance (Cm) within capacitance sense structure 902 may be driven according to a timing (i.e., signal Tx) established by synchronizing circuit 936.

In this way, a system may include an oscillator circuit with an integrating node that is charged and discharged via a current output port from a current conveyor circuit, where such a conveyor output current has a feedback component and sensed capacitance component, both of which are timed according to a synchronizing signal.

Having described capacitance sensing oscillator circuits controlled according to a synchronizing circuit, particular sensing operations having such synchronous control will now be described.

Embodiments, like those described above in FIGS. 7-9, may be conceptualized as having a relaxation oscillating frequency. That is, absent synchronous control, such circuits may oscillate at a frequency in a "relaxation oscillation" type operation. Such embodiments may vary in operation, depending upon differences in frequency between a relaxation oscillator frequency and synchronous control frequency. Such operating differences will now be described with reference to FIGS. 10A and 10B.

Figure 10A:
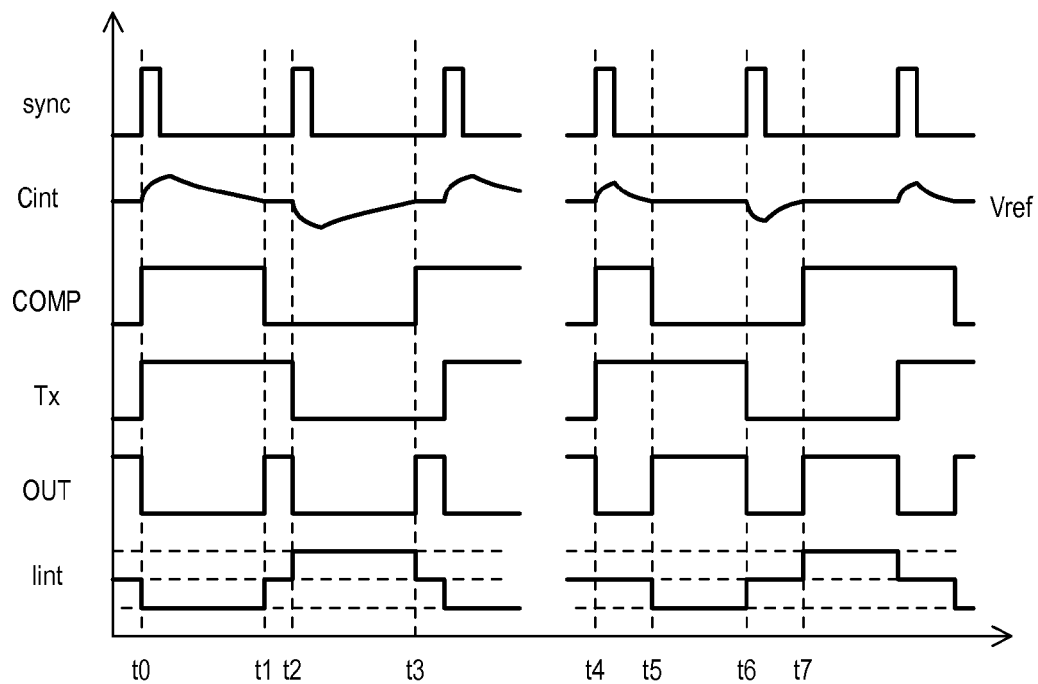
FIGS. 10A and 10B are timing diagrams showing operations of capacitance sensing systems having synchronous control CC based oscillator sections according to embodiments.

Referring to FIG. 10A, a capacitance sensing operation according to one embodiment is shown in a timing diagram. FIG. 10A shows an operation in which a synchronization control signal frequency is slower than a relaxation oscillating frequency. That is, a synchronization control signal period is longer than a circuit operation period.

FIG. 10A includes waveforms for a synchronization signal (sync), a voltage at an integrating capacitance (e.g., 820, 920) (Cint), an output of a comparator circuit (e.g., 834, 934) (COMP), an output signal from a flip-flip (e.g., 838, 938) (Tx), and output signal (OUT), and current signal (Iint) corresponding to current sourced to or sunk from the corresponding integrating capacitance.

The operation of FIG. 10A will now be described with reference to FIG. 8.

At about time t0, signal sync rises to an active level, and a high output of comparator (COMP) is clocked out as signal Tx. Signal Tx drives mutual capacitance Cm, resulting in an input current at input port (Xi) of current conveyor circuit 808. Current conveyor circuit 808 conveys this current to current output port (Iz+), resulting integrating capacitance Cint charging. At the same time, in response to a high output signal (Tx), switching current source circuit 834 enables sinking current source 830-1. With signals OUT and Tx both high, logic 840 drives output signal OUT low and switch 842 is enabled, allowing sinking current source 830-1 to sink current from integrating capacitance Cint. As a result, following time t0, a voltage at integrating capacitance Cint will start to fall.

At about time t1, a voltage at integrating capacitance Cint falls below a reference voltage (Vref), causing comparator circuit 824 to drive its output (COMP) low. With signal COMP low and signal Tx high, logic 840 will drive output signal OUT high. A high output signal (OUT) will open enabling switch 842, preventing switching current source 834 from sourcing current to or sinking current from integrating capacitance Cint.

At about time t2, signal sync again rises to an active level, and a low output of comparator (COMP) is clocked out as signal Tx. Signal Tx drives mutual capacitance Cm, resulting in an input current at input port (Xi) of current conveyor circuit 808. Current conveyor circuit 808 conveys this current to current output port (Iz+), resulting integrating capacitance Cint discharging (in the negative direction this time). At the same time, in response to a low output signal (Tx), sourcing source circuit 830-1 is enabled. With signals OUT and Tx both low, logic 840 drives output signal OUT low, and enabling switch 842 allows sourcing current source 830-1 to charge integrating capacitance Cint. As a result, following time t2, a voltage at integrating capacitance Cint will start to rise.

At about time t3, a voltage at integrating capacitance Cint rises above a reference voltage, causing comparator circuit 824 to drive its output (COMP) high. With signal COMP high and signal Tx low, logic 840 will drive output signal OUT high. A high output signal (OUT) will open enabling switch 842, preventing switching current source 834 from sourcing current to or sinking current from integrating capacitance Cint.

Following time t3, operations can continue as described for times t0 to t3, to continue generating an output signal in synchronism with signal sync.

Referring still to FIG. 10A, after time t3 and prior to time t4, it is assumed that a capacitance Cm changes, resulting in a lower capacitance value. As but one example, an object may be within a proximity of Cm, causing a drop in capacitance.

Operations at times t4 to t7 show substantially the same operations as described for times t0 to t3. However, due to a smaller capacitance, less current is conveyed by current conveyor, resulting in integrating capacitance (Cint) charging and discharging at a faster rate, as compared to the operation at times t0 to t3.

A comparison between operations at times t0-t3 and operations at times t4-t7 shows that while a period of output signal OUT may be the same in both cases, a duty cycle may differ. Thus, sensing a capacitance change in such an embodiment may include sensing changes in a duty cycle of output signal (OUT), rather than changes in a frequency of output signal (OUT).

Figure 10B:
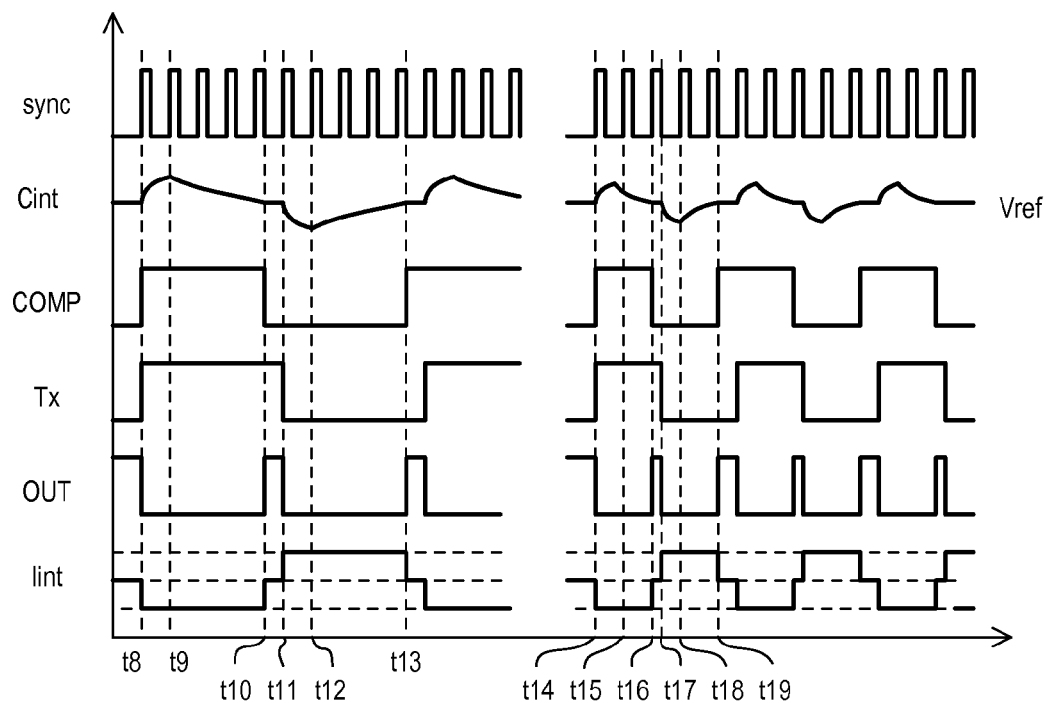

Referring to FIG. 10B, a capacitance sensing operation according to another embodiment is shown in a timing diagram. FIG. 10B shows an operation in which a synchronization control signal frequency is faster than a relaxation oscillating frequency. That is, a synchronization control signal period is shorter than a circuit operation period.

FIG. 10B includes the same waveforms as FIG. 10A. The operation of FIG. 10B will also be described with reference to FIG. 8.

At about time t8, signal sync rises to an active level, and a high output of comparator (COMP) is clocked out as signal Tx. Operations may follow those described above for time t0 in FIG. 10A.

At about time t9, signal sync may once again rise to an active level. However, because a comparator output (COMP) remains high, there is no change in operation. That is, current continues to sink from integrating capacitance Cint.

At about times t10 and t11, operations may occur as described for times t1 and t2 in FIG. 10A.

At about time t12, signal sync may once again rise to an active level. However, because a comparator output (COMP) remains low, there is no change in operation. That is, current continues to be sourced to integrating capacitance Cint.

At about time t13, operations may occur as described for time t3 in FIG. 10A. Following time t13, operations can continue as described for times t8 to t13, to continue generating an output signal OUT. It is noted that in this embodiment, unlike that of FIG. 10A, an output signal OUT does not vary at the frequency of signal sync, being more related to the "relaxation" operating frequency of the circuit.

Referring still to FIG. 10B, after time t13 and prior to time t14, it is assumed that a capacitance Cm changes, resulting in a lower capacitance value.

Operations at times t14 to t19 show substantially the same operations as described for times t8 to t13. However, due to a smaller capacitance, less current is conveyed by current conveyor, resulting in integrating capacitance (Cint) charging and discharging at a faster rate, as compared to the operation at times t8 to t13.

A comparison between operations between time t8-t13 and operations between times t14 and t19 shows that in this embodiment, a period of output signal OUT may vary in response changes in Cm. Thus, sensing a capacitance change in such an embodiment may include sensing changes in a frequency of output signal (OUT). However, other embodiments may measure a duty cycle difference, but may require multiple cycles to derive an accurate capacitance value reading.

In this way, a capacitance sensing system may include a current conveyor circuit that charges and discharges a node according to timing established by a synchronizing signal and not a free running oscillation frequency, where such a synchronizing signal may have a frequency greater than, or less than the free running oscillation frequency.

Synchronizing capacitance sensing circuits may allow sensing to be timed along multiple sense channels. An example of a system having multiple channels is shown in FIG. 11.

Figure 11:
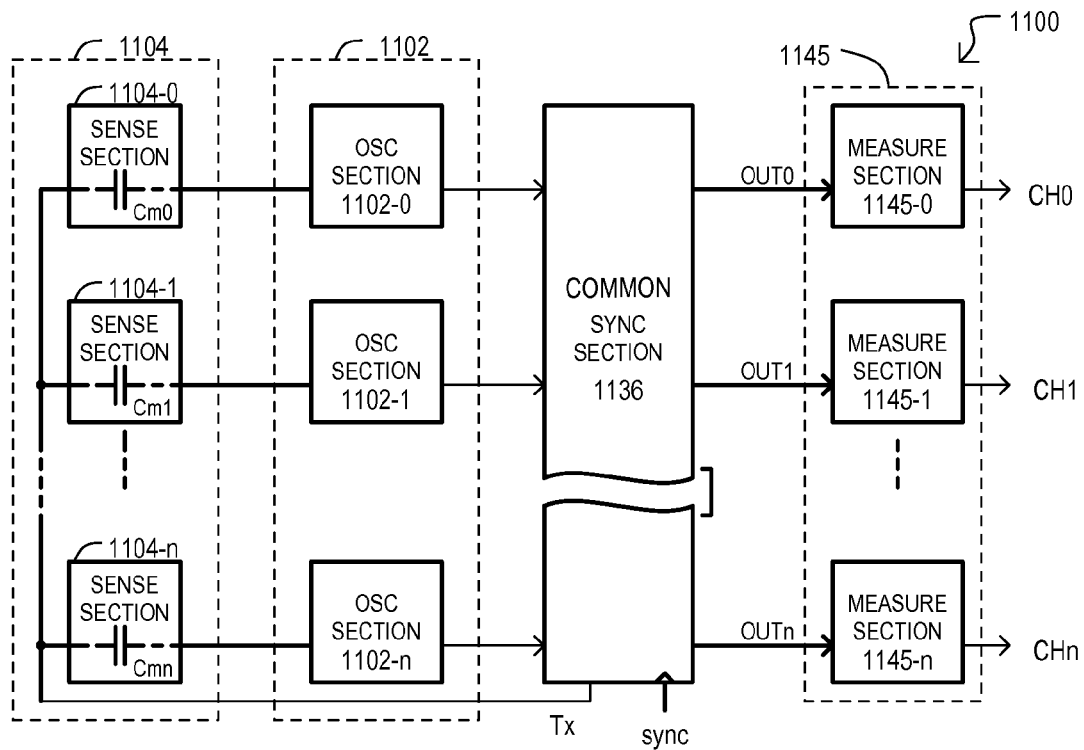
FIG. 11 is a block schematic diagram of a capacitance sensing system having multiple channels according to an embodiment.

Referring to FIG. 11, a capacitance sensing system 1100 may include multiple synchronized oscillating circuit sections 1102-0 to -n, each connected to a same capacitance sensing structure 1104 and measurement circuit 1145. Oscillating circuit sections (1102-0 to -n) may take the form of any of the oscillating circuits shown herein, or equivalents, but with transmit paths and feedback paths controlled by common synchronizing section 1136. A common synchronizing section 1136 may take the form of any of those shown a 736, 836 or 936 in FIGS. 7-10B, or an equivalent, but operating on multiple oscillating circuit sections.

A capacitance sensing structure 1104 may include multiple sections 1104-0 to -n, each of which may present a capacitance (Cm0 to Cmn) for measurement.

A measurement circuit 1145 may include measurement circuit sections (1145-0 to -n) that measure output values (OUT0 to -n) to make a capacitance sensing determination for such output values (CH0 to -n). In one embodiment, such measurement may include measuring a duty cycle and/or counting transitions in a given time period.

Each oscillating circuit section (1102-0 to -n) and its corresponding measurement section (1145-0 to -n), along with common synchronizing section 1136 may be conceptualized as a sensing "channel", that provides a different sensing result (CH0 to CHn).

In this way, multiple synchronized oscillating circuits with current conveyors may make capacitances sensing operations on multiple channels.

Figure 12:
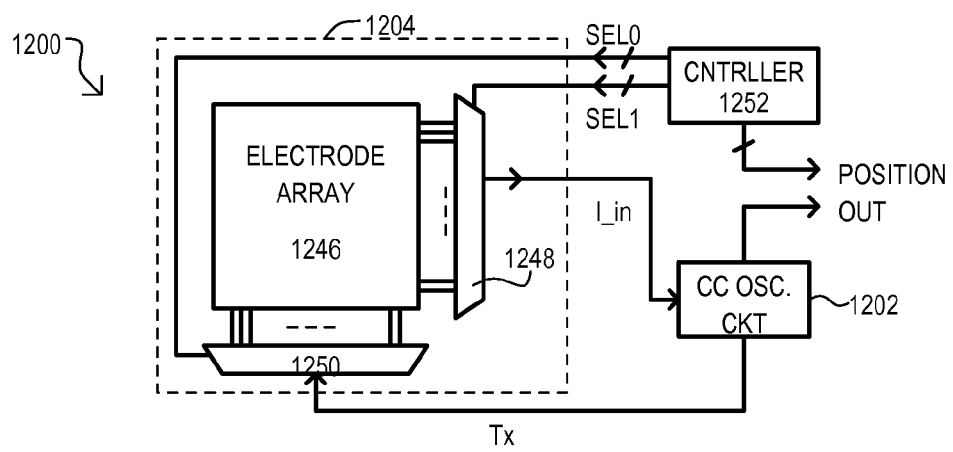
FIG. 12 is a block schematic diagram of a capacitance sensing system having a CC based oscillator according to a further embodiment.

Referring to FIG. 12, a capacitance sensing system according to yet another embodiment is shown in a block schematic diagram and designated by the general reference character 1200. A capacitance sensing system 1200 may include a current conveyor based oscillating circuit 1202, a capacitance sense structure 1204, and a controller circuit 1252. An oscillating circuit 1202 may include a current conveyor circuit, and in particular embodiments may take the form of, or operate in the same manner as, any of those embodiments shown in FIGS. 1-10B.

A capacitance sense structure 120 may include an electrode array 1246, a receive (Rx) selection circuit 1248, and a transmit selection circuit (Tx) 1250. An electrode array 1246 may include a number of sense electrodes selectable by Rx and Tx selection circuits (1248 and 1250).

Tx selection circuit 1250 may be connected between oscillating circuit 1202 and electrode array 1246. In response to control signals (SEL0) from controller 1252, Tx selection circuit 1250 may connect one or more electrodes from electrode array 1246 to receive an output Tx from oscillating circuit 1202. Rx selection circuit 1248 may also be connected between oscillating circuit 1202 and electrode array 1246. In response to control signals (SEL1) from controller 1252, Rx selection circuit 1250 may connect one or more electrodes from electrode array 1246 to a current input port of a current conveyor circuit within oscillating circuit 1202. Thus, according to selection signals SEL0 and SEL1, a mutual capacitance between selected electrodes within electrode array 1246 may be connected to oscillating circuit 1202, allowing operations of oscillating circuit 1202 to vary in responses to such a mutual capacitance.

Controller 1252 may generate control signals (SEL0, SEL1) for enabling connections through selection circuits (1248, 1250). Controller 1252 may also output position data (POSITION) corresponding to electrodes connected to oscillator circuit 1202. Position data (POSITION) in combination with a measured capacitance value (OUT) can be utilized to establish a position of an object on, or in proximity to, electrode array 1246.

In this way, a system may include a current conveyor based oscillator circuit that varies an output signal in response to an input current generated by a mutual capacitance between various electrodes selected from an electrode array.

Figure 13:
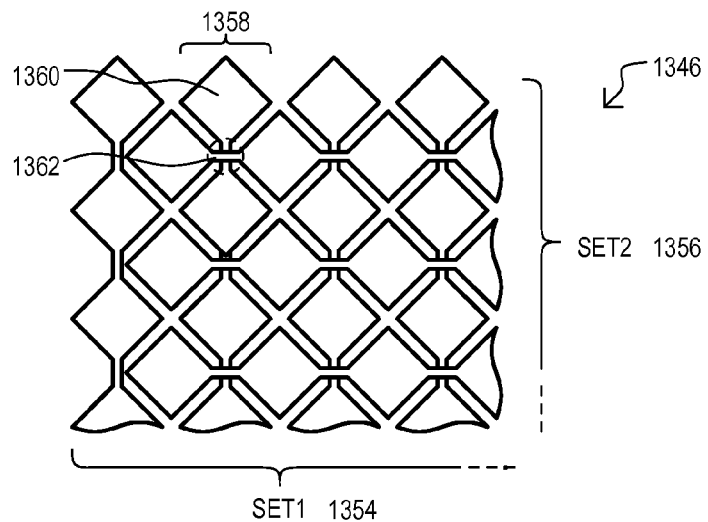
FIG. 13 is a top plan view of an electrode array that may be included in embodiments.

Referring to FIG. 13, a portion of an electrode array that may be included in embodiments is shown in a top plan view, and designated by the general reference character 1346. Electrode array 1346 may include a first set of electrodes 1354 and a second set of electrodes 1356 having electrodes that are substantially perpendicular to one another. Each electrode (one shown as 1358) may include a number of wide sense sections (one shown as 1360) connected to one another at narrower cross-over regions (one shown as 1362), where an electrode from one group intersects that of another group.

In one very particular embodiment, an electrode from one set (e.g., 1354 or 1356) may be connected to receive a Tx output from an oscillator circuit, while an electrode from another set (e.g., 1356 or 1354) may be connected to provide a current input to a CC based oscillator circuit. In such an arrangement, an oscillator circuit operation may vary in response to a mutual capacitance between the selected electrodes.

Figure 14A:
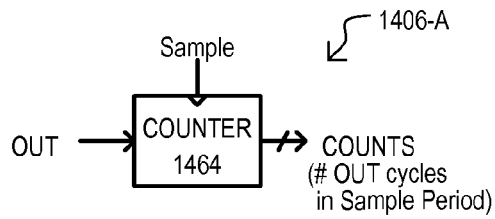
FIGS. 14A to 14C are block schematic diagrams of measurement circuits that may be included in embodiments.
Figure 14B:
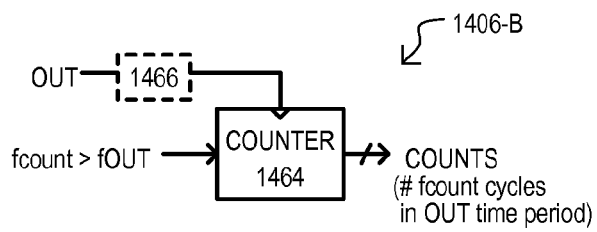
Figure 14C:
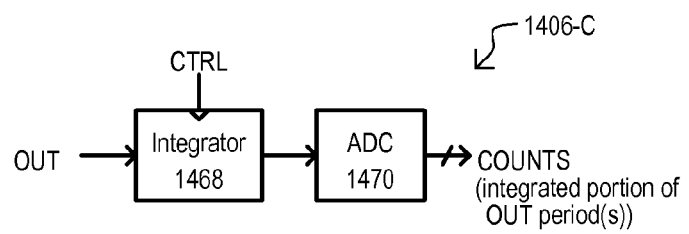

Referring now to FIGS. 14A to 14C, capacitance value generators that may be included in embodiments are shown in block schematic diagrams.

Referring now to FIG. 14A, a capacitance value generator according to one embodiment is shown in a block schematic diagram and designated by the general reference character 1406-A. A capacitance value generator 1406-A may be included in systems having current conveyor based oscillator circuits that provide an output signal (OUT) having a frequency that may change in response to changes in a sensed capacitance. Capacitance value generator 1406-A may include a counter circuit 1464 having an input that receives an oscillator output signal OUT and a counter output that provides a count value COUNTS. A signal (Sample) may start and reset a counting operation. In one embodiment, signal Sample may enable counting over constant time period.

In an embodiment like that of FIG. 14A, in the absence of an object (e.g., relatively higher mutual capacitance Cm and lower OUT frequency), a count may have one value or range (e.g., a lower count number). In the presence of an object (e.g., lower mutual capacitance Cm and higher OUT frequency), a count may have another value or range (e.g., a higher count number).

Referring now to FIG. 14B, a capacitance value generator according to another embodiment is shown in a block schematic diagram and designated by the general reference character 1406-B. A capacitance value generator 1406-B may be included in systems having current conveyor based oscillator circuits that provide an output signal (OUT) having a duty cycle that may change in response to changes in a sensed capacitance. Capacitance value generator 1406-B may include a counter circuit 1464 and optionally, control logic 1466. A counter circuit may have an input that receives a counting signal fcount having a frequency substantially larger than that of an oscillator output signal OUT. An output signal (OUT) may start and reset a counting operation. Thus, when an oscillator output signal has one value (e.g., high or low portion of a duty cycle), a counting operation may occur.

An optional control logic circuit 1466 may vary how an output signal OUT is applied to counter circuit 1464. For example, control logic 1466 may control which logic level of signal OUT enables counting and/or how many periods of output signal (OUT) are utilized in a counting operation.

In an embodiment like that of FIG. 14B, in the absence of an object (e.g., higher mutual capacitance Cm and longer low portion of duty cycle), a count may have one value or range (e.g., a higher count number). While the presence of an object (e.g., lower mutual capacitance Cm and shorter low portion of duty cycle), a count may have another value or range (e.g., a lower count number).

Referring now to FIG. 14C, a capacitance value generator according to another embodiment is shown in a block schematic diagram and designated by the general reference character 1406-C. A capacitance value generator 1406-C may be included in systems having current conveyor based oscillator circuits that provide an output signal (OUT) having a duty cycle that may change in response to changes in a sensed capacitance. Capacitance value generator 1406-C may include an integrator circuit 1468 and an analog-to-digital converter (ADC) 1470.

An integrator 1468 may integrate an oscillator output signal OUT over a time period established by signal CTRL. Control signal CTRL may control which portions of a duty cycle are integrated and/or how many periods of output signal (OUT) are integrated. ADC 1470 may convert an analog value generated by integrating signal OUT into a digital count value.

In an embodiment like that of FIG. 14C, in the absence of an object (e.g., high mutual capacitance Cm), a count may have one value or range (e.g., a higher count number due to integration of greater signal area). While the presence of an object (e.g., lower mutual capacitance Cm), a count may have another value or range (e.g., a lower count number due to integration of smaller signal area).

As noted above, embodiments may include current conveyor circuits to convey a current that varies in response to a change in a sensed capacitance. First generation current conveyor circuits may have a response given by the following matrix relationship:

$$\begin{pmatrix} I_Y \\ V_X \\ I_{Z-/+} \end{pmatrix} = \begin{pmatrix} 0 & 1 & 0 \\ 1 & 0 & 0 \\ 0 & +/-1 & 0 \end{pmatrix} \begin{pmatrix} V_Y \\ I_X \\ V_Z \end{pmatrix}$$

However, as also noted above, other embodiments may include second generation type CC circuits (CCII). CCII circuits may have a response given by the following matrix relationship:

$$\begin{pmatrix} I_Y \\ V_X \\ I_{Z-/+} \end{pmatrix} = \begin{pmatrix} 0 & 0 & 0 \\ 1 & 0 & 0 \\ 0 & +/-1 & 0 \end{pmatrix} \begin{pmatrix} V_Y \\ I_X \\ V_Z \end{pmatrix}$$

Figure 15:
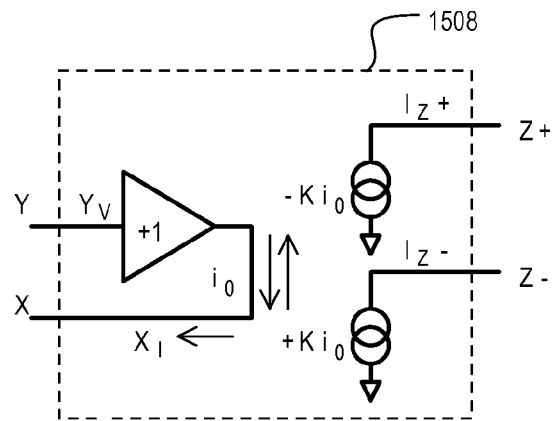
FIG. 15 is a block diagram representation of a second generation current conveyor circuit (CCII) that may be included in embodiments.

Referring now to FIG. 15, one representation of a CCII circuit that may be included in embodiments is shown in a block diagram and designated by the general reference character 1508. CCII circuit 1508 may include an input port X, an input port Y, an output port IZ+ and an output port IZ−. Port X may be a low impedance current input port, Port Y may be a high impedance voltage input, Ports IZ+ and IZ− may be high impedance current output ports. A voltage applied at input terminal Y ($V_Y$) may be conveyed as a voltage at input terminal X (i.e., $V_X = V_Y$).

A current at input terminal X ($I_X$) may be conveyed as an output current at output terminals IZ+, IZ−. It is noted that current at such output terminals may mirror one another in opposing directions (e.g., $I_X = -IZ+$, and $I_X = IZ-$).

Figure 16:
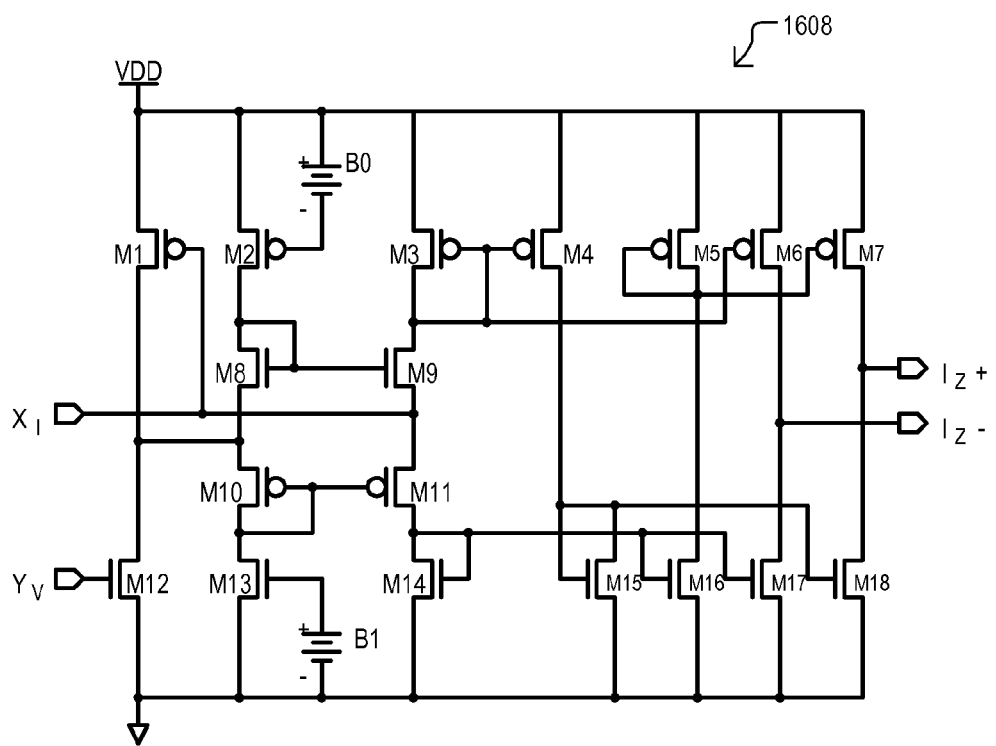
FIG. 16 is a schematic diagram of a CCII that may be included in embodiments.

Referring now to FIG. 16, a very particular example of a CCII circuit that may be included in embodiments is shown in a schematic diagram, and designated by the general reference character 1608. A CCII circuit 1608 may include an input stage (transistors M1 and M12), current bias source stages (transistor/bias stage combinations M2/B0, M13/B1), a voltage follower stage (transistors M8 to M11), output current mirrors (M3, M4, M6, M14, M16, M17), and current mirrors M5, M7, M15, M18.

FIG. 16 is one possible CCII circuit that may be included in embodiments. Other embodiments may include different CCII circuits.

The above embodiments have shown systems, circuits and methods in block diagrams and timing diagrams. Additional method embodiments will now be described with reference to flow diagrams.

Figure 17:
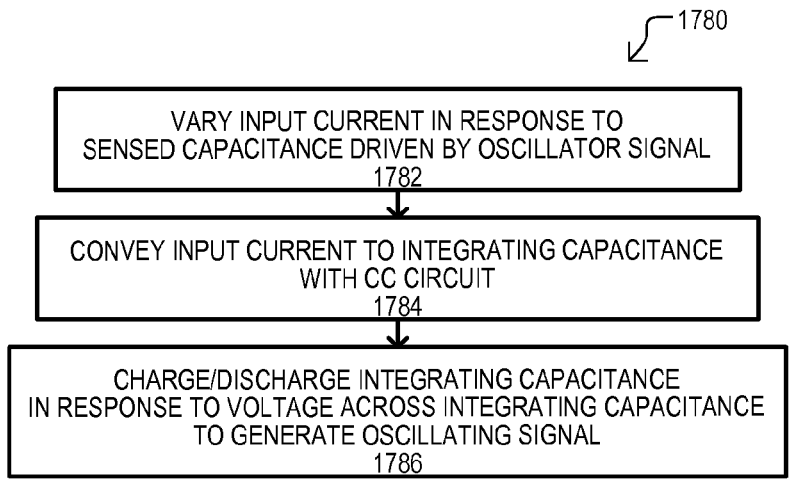
FIG. 17 is a flow diagram of a method according to an embodiment.

Referring to FIG. 17, a method according to an embodiment is shown in flow diagram and designated by the general reference character 1780. A method 1780 may include varying an input current in response to a sensed capacitance driven by an oscillator signal (1782). Such an action may include driving one electrode of a capacitor with the oscillating signal to induce a current at an opposing electrode.

An input current may be conveyed to an integrating capacitance with a current conveyor circuit (1784). Such an action may include receiving an input current at a low impedance CC input port, and generating a corresponding output current at a high impedance CC output port. Because a CC input current may vary according to a capacitance, a resulting CC output current may also vary according to the capacitance.

An integrating capacitance may be charged and discharged according to a voltage across the integrating capacitance to generate the oscillating signal (1786). In particular embodiments, such action may include utilizing a negative feedback loop that causes the integrating capacitance to start charging once it falls below a certain voltage level, and to start discharging once it rise above a certain voltage level.

Figure 18:
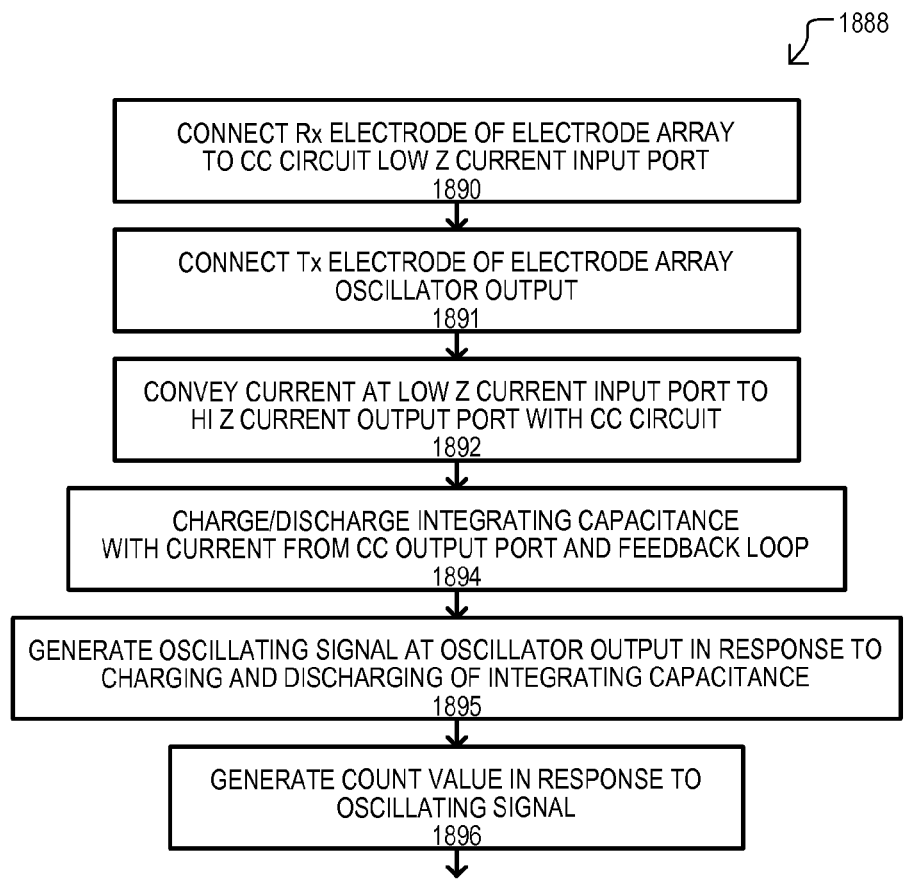
FIG. 18 is a flow diagram of a method according to another embodiment.

Referring to FIG. 18, a method according to another embodiment is shown in a flow diagram and designated by the general reference character 1888. A method 1888 may include connecting a receive (Rx) electrode of an electrode array to a CC circuit low impedance current input port (1890). A method 1888 may also include connecting a transmit (Tx) electrode of the electrode array to an oscillator output (1891). In particular embodiments, such actions may include sequentially connecting electrodes to a CC circuit and oscillator output to generate mutual capacitance values between electrode sets. A current at the low impedance current input port may be conveyed to a high impedance current output port with a current conveyor circuit (1892).

An integrating capacitance may be charged with a current from the CC output port and from a feedback loop (1894). In particular embodiments, such an action may include applying a negative feedback current at an output port of a CC circuit and/or at an input port of CC circuit. An oscillating signal may be generated at the oscillating output in response to a charging and discharging of an integrating capacitance (1895).

A method 1888 may also include generating a count value in response to an oscillating signal (1896). In particular embodiments, such an action may include generating a count value that varies according to a frequency of an oscillating signal and/or generating a count value that varies according to duty cycle of an oscillating signal.

While embodiments above have shown oscillator circuits that include current conveyors, alternate embodiments may include oscillator circuits that employ switched capacitor circuits in lieu of conventional resistors. One such embodiment is shown in FIG. 19.

Figure 19:
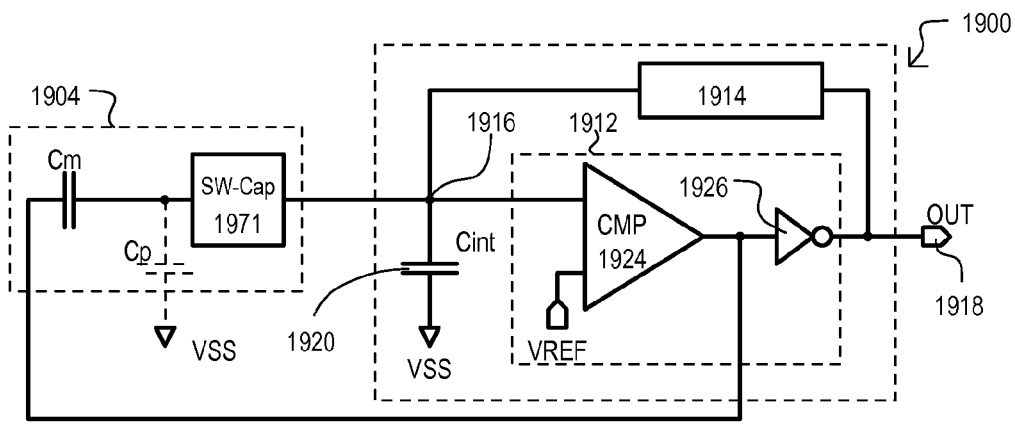
FIG. 19 is a block schematic diagram of a relaxation oscillator circuit that includes a switched capacitor input resistance circuit.

Referring now to FIG. 19, a capacitance sensing system according to another embodiment is shown in a block diagram and designated by the general reference character 1900. A system 1900 may include an oscillator circuit 1902 and a capacitance sense structure 1904.

Unlike embodiments shown above, a capacitance sense structure 1904 may include a mutual capacitance Cm, an input switched capacitor circuit 1971, and optionally, a "self" capacitance Cp. An input switched capacitor circuit 1971 may operate to provide a resistor substitute created by a switched capacitor circuit. Consequently, a system 1900 may be more compact as a conventional resistor is not included at an input to oscillator circuit 1902.

An oscillator circuit 1902 may include an integrating capacitor 1920, a comparator section 1912, and a feedback path 1914. An integrating capacitor 1920 may be connected between integrating node 1916 and a reference voltage, which in this example may be a low power supply voltage VSS.

A comparator section 1912 may generate an output value that varies based on a comparison between a reference voltage (VREF) and a voltage at integrating node 1916. In the particular embodiment shown, a comparator section 1912 may include a comparator circuit 1942 and an inverting buffer 1926. A comparator circuit 1942 can have a first input connected to integrating node 1916, a second input connected to a reference voltage (VREF), and an output that drives sense structure 1904. Inverting buffer 1926 can have an input connected to the output of comparator circuit 1942, and an output to feedback path 1914. According to a potential at integrating node 1916, a comparator section 1912 may drive an output signal OUT on output node 1918. This, in combination with feedback path 1914 (which may be a negative feedback path), may generate an oscillating output signal.

In such an arrangement, an output from comparator circuit 1924 can drive sensed capacitance Cm. As Cm changes, an induced input current can charge integrating node 1916 through switched capacitor circuit 1971. A rate at which switched capacitor circuit 1971 switches can be tuned to give a desired oscillating response.

It is understood that other embodiments shown herein, may include an input switched capacitor resistance type circuit as shown in FIG. 19.

In this way, a system may include an oscillator circuit having a switched capacitor resistance equivalent at an input.

Figure 20:
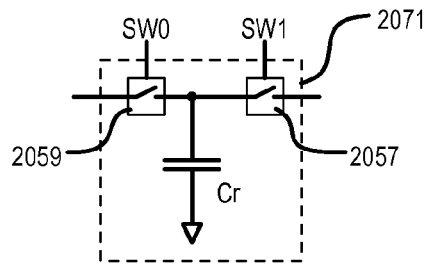
FIG. 20 is a schematic diagram of a switched capacitor circuit that can be included in embodiments shown herein.

Referring now to FIG. 20, a switched capacitor circuit that can be included in the embodiments is shown in a schematic diagram and designated by the general reference character 2071. Such a circuit may be one version of that shown as 1971 in FIG. 19.

A switched capacitor circuit 2071 may include an input switch 2059, an output switch 2057, and a capacitance Cr. A resistance equivalence can be provided based on a switching rate between switches 2057 and 2059.

While embodiments above have shown oscillator circuits that include current conveyors and switched capacitor circuits, further embodiments may include programmable current sources in the feedback loop of the oscillator. Various embodiments having such a feature will now be described with reference to FIGS. 21 to 24.

Figure 21:
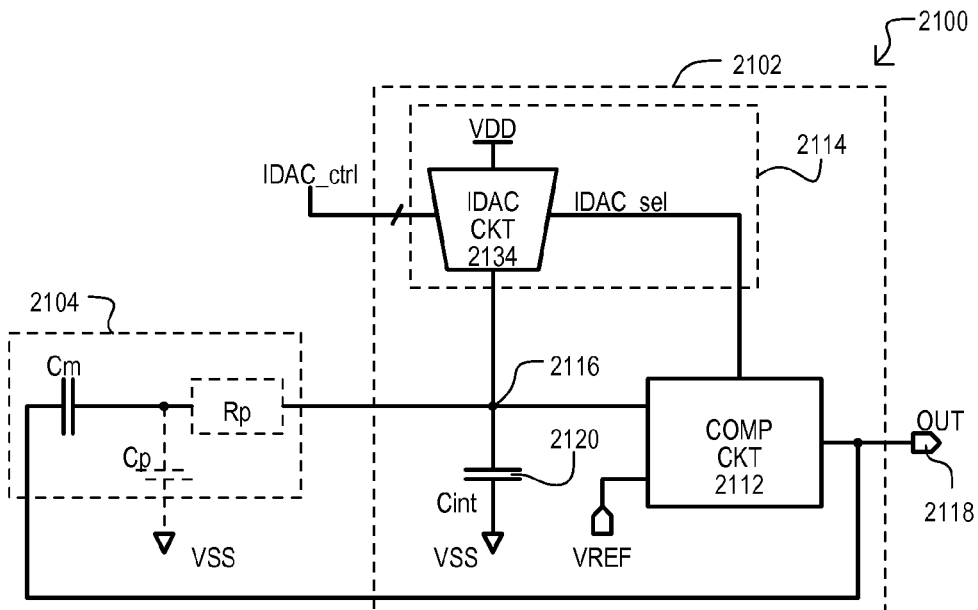
FIG. 21 is a schematic diagram of a relaxation oscillator circuit that includes a programmable current source in a feedback loop.

Referring now to FIG. 21, a capacitance sensing system according to another embodiment is shown in a block diagram and designated by the general reference character 2100. A system 2100 may include an oscillator circuit 2102 and a capacitance sense structure 2104.

A capacitance sense structure 2104 may include a mutual capacitance Cm and optionally an input resistance Rp, and/or a "self" capacitance Cp. An input resistance Rp may be a conventional resistor, or may be a switched capacitor circuit like that shown in FIG. 19.

An oscillator circuit 2102 may include an integrating capacitor 2120, a comparator section 2112, and a feedback path 2114 with a programmable current source circuit 2134. An integrating capacitor 2120 may be connected between integrating node 2116 and a reference voltage, which in this example may be a low power supply voltage VSS. A comparator section 2112 may generate an output value that varies based on a comparison between a reference voltage (VREF) and a voltage at integrating node 2116.

Feedback path 2114 includes a programmable current source circuit 2134, which in the embodiment shown, can be a switchable programmable current digital-to-analog converter (IDAC). Programmable IDAC 2134 can provide one or more currents having magnitudes that are programmable in response to digital input values IDAC_ctrl. Such programmable currents can be applied to integrating node 2116 in response to an output of comparator section 2112. In such an arrangement, an oscillator response can be tuned using programmable current source circuit 2134.

In this way, a system may include an oscillator circuit having a programmable current source in a feedback loop.

Figure 22:
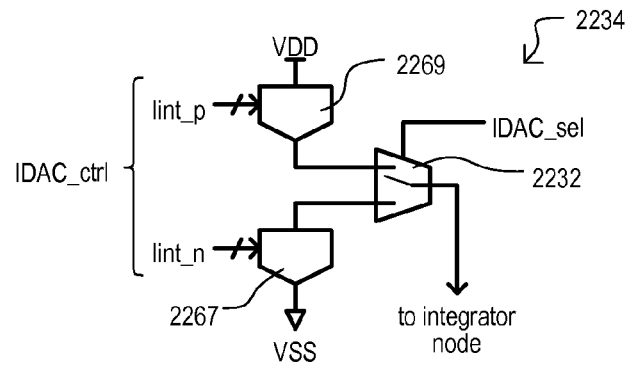
FIG. 22 is a schematic diagram of a programmable current source that can be included in embodiments shown herein.

Referring now to FIG. 22, a programmable IDAC that can be included in the embodiments is shown in a schematic diagram and designated by the general reference character 2234. Such a circuit may be one version of that shown as 2134 in FIG. 21.

A programmable IDAC may include a source IDAC 2269, a sink IDAC 2267, and a current switch 2232. A source IDAC 2269 can be programmed by an input value Iint_p to generate a current that can be sourced to an integrating node. Conversely, A sink IDAC 2267 can be programmed by an input value Iint_n to generate a current that can be sunk from an integrating node. Current switch 2232 can selectively connect either a source IDAC 2269 or sink IDAC 2267 to an integrating node in response to a control signal IDAC_sel. In some embodiments, a control signal IDAC_sel can correspond to an output of an oscillator circuit.

Figure 23:
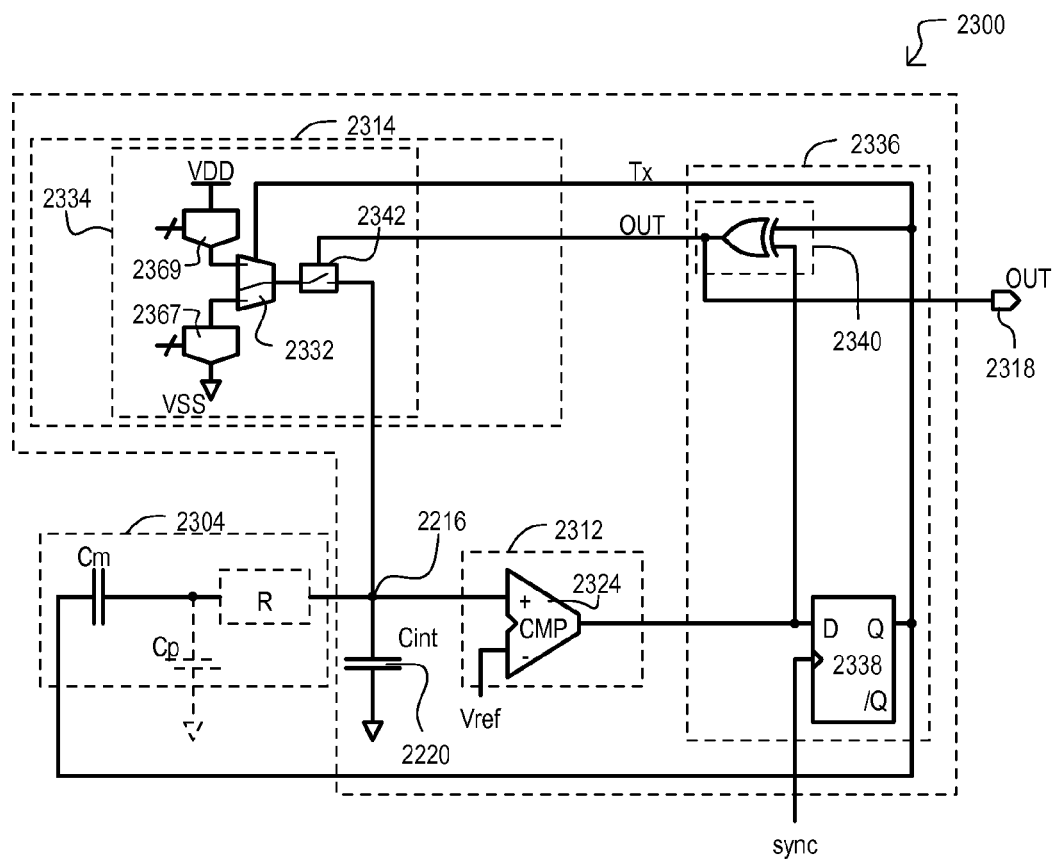
FIG. 23 is a schematic diagram of a relaxation oscillator circuit having a programmable current source like that shown in FIG. 22.

Referring now to FIG. 23, a capacitance sensing system according to another embodiment is shown in a block diagram and designated by the general reference character 2300. A system 2300 may be one very particular implementation of that shown in FIG. 21.

FIG. 23 differs from FIG. 21 in that a programmable current source 2334 may particularly take the form of that shown in FIG. 22. A comparator section 2312 may include a comparator circuit 2324. Further, an oscillator circuit 2302 includes a synchronizing circuit 2336 like that shown as 836 in FIG. 8. Such a synchronizing circuit 2336 may operate in the same manner as 836. Such synchronization may enable an oscillator circuit 2302 be repeated across multiple channels, with each channel being sampled in a different time period.

In this way, an oscillator circuit may include a programmable current source in a feedback path enabled by a synchronizing circuit.

Figure 24:
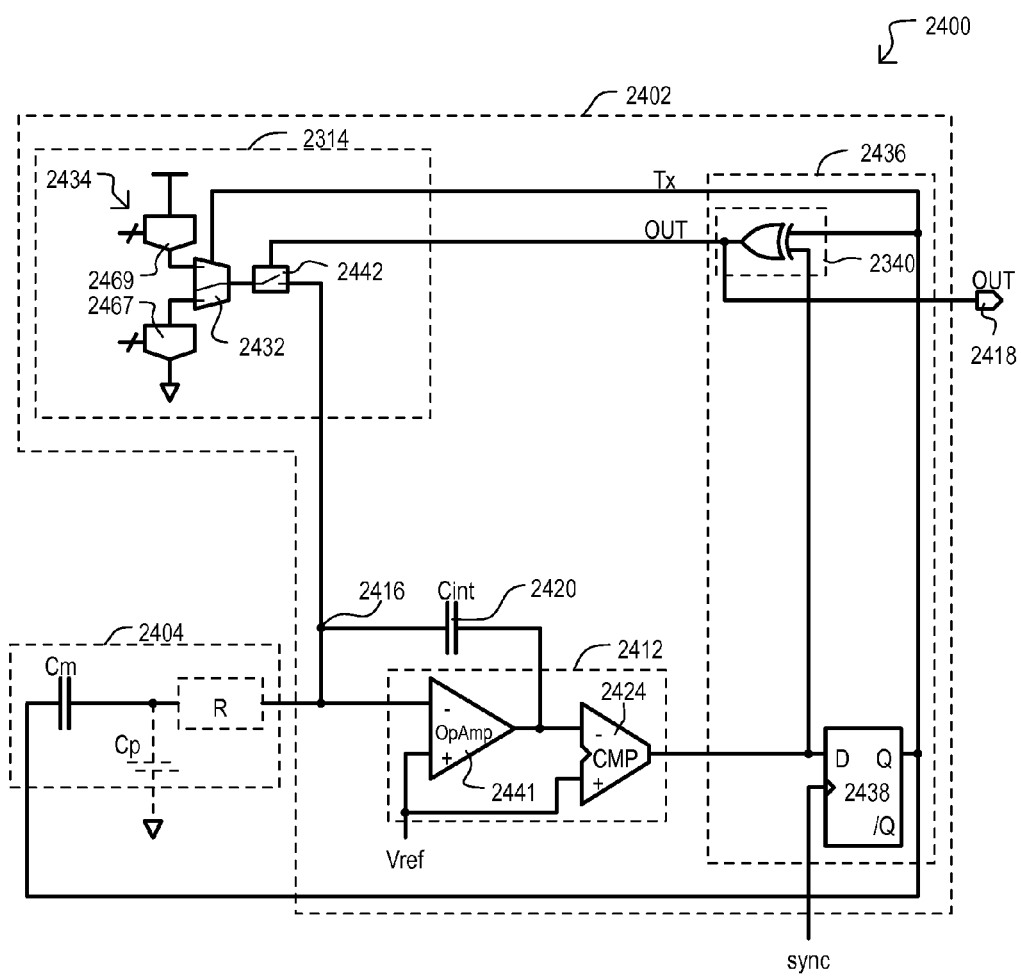
FIG. 24 is a schematic diagram of an opamp based relaxation oscillator circuit having a programmable current source.
Figure 25:
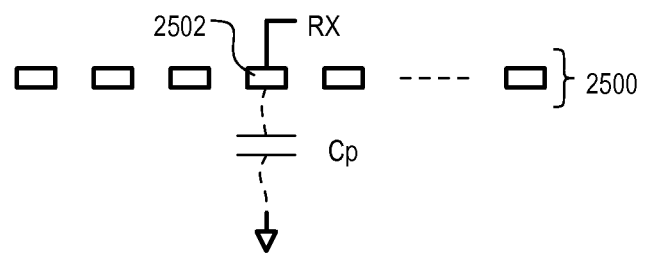
FIG. 25 is a diagram showing conventional self-capacitance sensing.
Figure 26:
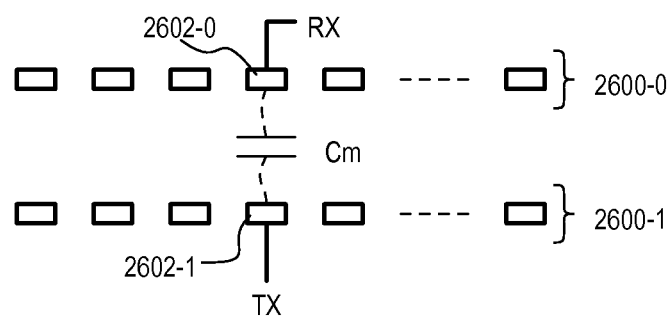
FIG. 26 is a diagram showing conventional mutual capacitance sensing.

Referring now to FIG. 24, a capacitance sensing system according to another embodiment is shown in a block diagram and designated by the general reference character 2400. A system 2400 may be another particular implementation of that shown in FIG. 21.

FIG. 24 includes sections like those shown for FIG. 23. FIG. 24 differs from FIG. 23 in that a comparator section 2412 may include an operational amplifier (opamp) 2441 and a comparator circuit 2424. Opamp 2441 can have an inverting input (−) connected to integrating node 2416, a non-inverting input (+) connected to a reference voltage (Vref), and an output connected to comparator circuit 2424. An integrating capacitor Cint can be connected between the output and inverting input of opamp 2441. Comparator circuit 2424 can a first input connected to the output of opamp 2441, a second input connected to the reference voltage (Vref), and an output connected to a D input of flip-flop 2438.

In this way, an oscillator circuit can an opamp based comparator section along with a programmable current source in a feedback path.

Embodiments disclosed herein may provide capacitance sensing in which an output signal is generated that has a period corresponding to a sensed capacitance. Such an arrangement may provide for easy detection of capacitance changes.

Embodiments disclosed herein may provide capacitance sensing that include a low impedance input for a sensed signal. This may suppress noise that may arise in such input signals as compared to systems having higher impedance current inputs.

Embodiments disclosed herein may provide feedback paths with programmable current sources to enable oscillating frequencies and responses to be set according to particular applications.

Embodiments disclosed herein may provide capacitance sensing of a mutual capacitance between electrodes without having a rectification circuit, for easier and/or less costly implementation, as compared to approaches that rectify an input signal.

Embodiments disclosed herein may provide capacitance sensing of a mutual capacitance without having to include a sample and hold circuit, as may be included in other approaches, for easier and/or less costly implementation.

Embodiments disclosed herein may provide capacitance sensing of a mutual capacitance between electrodes without an analog-to-digital converter, as may be included in other approaches, for easier and/or less costly implementation.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A capacitance sensing system, comprising:
   a current conveyor circuit coupled to receive an induced current from a capacitance sensing structure at a low impedance current input port; and
   a comparator having an input coupled to a high impedance current output port of the current conveyor circuit, and an output coupled to the current conveyor circuit by a feedback path and coupled to drive the capacitance sensing structure to generate the induced current.

2. The capacitance sensing system of claim 1, wherein:
   the capacitance sensing structure comprises
      a plurality of electrodes, and
      a selection circuit that selectively couples at least one electrode to the low impedance current input port of the current conveyor circuit and at least another electrode to the output of the comparator.

3. The capacitance sensing system of claim 1, wherein:
   the current conveyor circuit is a second generation current conveyor circuit further including a high impedance voltage port, and a voltage at the current input port follows a voltage applied at the voltage input port.

4. The capacitance sensing system of claim 1, wherein:
   the feedback path comprises a programmable current source that varies a current flow at the high impedance current output port of the current conveyor circuit in response to the output of the comparator.

5. A capacitance sensing system, comprising:
   a current conveyor circuit configured to convey a current at a low impedance current input port to an integrating capacitance via a high impedance current output port;
   a comparator circuit having an input coupled to the integrating capacitance; and
   a feedback path that varies the current conveyed at the current output port in response to an output of the comparator circuit.

6. The capacitance sensing system of claim 5, further including:
   a synchronizing circuit that selectively enables the feedback path in response to a synchronizing signal.

7. The capacitance sensing system of claim 6, wherein:
   the feedback path comprises a controllable current source that sinks or sources current in response to an output of the synchronizing circuit, and is selectively connected to the current conveyor in response to an output of the synchronizing circuit.

8. The capacitance sensing system of claim 6, wherein:
   the synchronizing circuit comprises a latch circuit having an input coupled to an output of the comparator circuit, an output coupled to the feedback path , and a latch control input coupled to receive the synchronizing signal.

9. The capacitance sensing system of claim 8, wherein:
   the synchronizing circuit further includes logic that logically combines an output from the comparator circuit with an output of the latch circuit to generate a logic signal; and
   the feedback path comprises a controllable current source that sinks or sources current in response to an output of the latch circuit, and is selectively connected with the current conveyor circuit in response to the logic signal.

10. The capacitance sensing system of claim 5, further including:
    a capacitance sensing circuit that capacitively couples an output of the comparator circuit to the low impedance current input port of the current conveyor circuit by a mutual capacitance between at least two electrodes.

\* \* \* \* \*